United States Patent
Yu et al.

(10) Patent No.: US 8,072,363 B2
(45) Date of Patent: Dec. 6, 2011

(54) SYSTEM AND METHOD FOR BANDPASS SIGMA-DELTA MODULATION

(75) Inventors: Rui Yu, Singapore (SG); Yong Ping Xu, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 12/672,348

(22) PCT Filed: Aug. 11, 2008

(86) PCT No.: PCT/SG2008/000295
§ 371 (c)(1),
(2), (4) Date: Jun. 16, 2010

(87) PCT Pub. No.: WO2009/022989
PCT Pub. Date: Feb. 19, 2009

(65) Prior Publication Data
US 2010/0259431 A1    Oct. 14, 2010

Related U.S. Application Data

(60) Provisional application No. 60/955,208, filed on Aug. 10, 2007.

(51) Int. Cl.
*H03M 3/00* (2006.01)
(52) U.S. Cl. .................................. 341/143; 341/155
(58) Field of Classification Search ............... 341/143, 341/155, 156
See application file for complete search history.

(56) References Cited

U.S. PATENT DOCUMENTS

| 5,392,042 | A  | * | 2/1995  | Pellon ........................ 341/143 |
| 5,585,801 | A  | * | 12/1996 | Thurston .................... 341/143 |
| 5,757,301 | A  | * | 5/1998  | Kuo et al. .................. 341/143 |
| 6,396,341 | B1 | * | 5/2002  | Pehlke ........................ 330/10 |
| 6,396,428 | B1 | * | 5/2002  | Cheng ........................ 341/143 |
| 6,583,742 | B1 | * | 6/2003  | Hossack ..................... 341/144 |
| 6,674,381 | B1 | * | 1/2004  | Gomez et al. .............. 341/143 |
| 6,697,003 | B1 | * | 2/2004  | Chen .......................... 341/143 |
| 6,940,436 | B2 | * | 9/2005  | Hezar et al. ................ 341/143 |
| 7,119,725 | B1 | * | 10/2006 | Shih ........................... 341/143 |
| 7,183,957 | B1 | * | 2/2007  | Melanson .................. 341/143 |
| 7,362,252 | B1 |   | 4/2008  | Pai |
| 2002/0180629 | A1 | * | 12/2002 | Liu et al. ................... 341/143 |
| 2005/0068213 | A1 | * | 3/2005  | Fontaine et al. .......... 341/143 |
| 2005/0116850 | A1 |   | 6/2005  | Hezar et al. |

FOREIGN PATENT DOCUMENTS

JP    2004040764    2/2004

OTHER PUBLICATIONS

International Search Report for Application, PCT/SG2008/000295, dated Sep. 12, 2008, 2 pages.

(Continued)

*Primary Examiner* — Jean B Jeanglaude
(74) *Attorney, Agent, or Firm* — Schwabe, Williamson & Wyatt, P.C.

(57) ABSTRACT

Various embodiments of this disclosure may describe a bandpass sigma-delta modulator (BP ΣΔM) comprising an electromechanical filter, a quantizer coupled to the electromechanical filter, and a feedback circuit coupled between the quantizer and the electromechanical filter. Other embodiments be also be disclosed or claimed.

17 Claims, 6 Drawing Sheets

OTHER PUBLICATIONS

International Preliminary Report on Patentability for Application, PCT/SG2008/000295, dated Feb. 16, 2010, 6 pages.

Inerfield et al. "High Dynamic Range InP HBT Delta-Sigma Analog-to-Digital Converters," IEEE Journal of Solid-State Circuits, vol. 38, No. 9, pp. 1524-1532, Sep. 2003.

Cosand et al. "IF-Sampling Fourth-Order Bandpass U Modulator for Digital Receiver Applications," IEEE Journal of Solid-State Circuits, vol. 39, No. 10, pp. 1633-1639, Oct. 2004.

Xu et al. "A Silicon Micromechanical Resonator Based CMOS Bandpass Sigma-Delta Modulator," in Proc. of Asian Solid-State Circuit Conference (A-SSCC '06), Nov. 2006. pp. 143-146.

Bannon III et al. "High-Q HF Microelectromechanical Filters," IEEE Journal of Solid-State Circuits. vol. 35, pp. 512-526, Apr. 2000.

Schreier et al. Understanding Delta-Sigma Data Converters. IEEE Press, 2005, Chapter 9 Example Modulator Systems, pp. 326-363.

Nordin et al. "Modeling and Fabrication of CMOS Surface Acoustic Wave Resonators", IEEE Transactions on Microwave Theory and Techniques, vol. 55, No. 5, May 2007.

Yu et al. "A 47.3-MHz SAW Resonator Based CMOS Second-Order Bandpass Sigma-Delta Modulator with 54-dB Peak SNDR," in Proc. IEEE Custom Integrated Circuits Conf. CICC'05, pp. 203-206, Sep. 5, 2005.

Rui Yu, Yong Ping Xu, "Bandpass Sigma-Delta Modulator Employing SAW Resonator as Loop Filter" IEEE Transactions on Circuits and Systems-I: Regular Papers, Apr. 2007, vol. 54, No. 4, pp. 723-735.

Desvergne et al., RF Lamb Resonators in Bandpass Delta-Sigma Converters for Digital Receiver Architectures, Curcuits and Systems, 2007. NEWCAS 2007, IEEE Northeast Workshop on Aug. 8, 2007, pp. 449-452.

* cited by examiner

SYSTEM AND METHOD FOR BANDPASS SIGMA-DELTA MODULATION

CROSS REFERENCE TO RELATED APPLICATIONS

The present application is a national phase entry under 35 U.S.C. §371 of International Patent Application No. PCT/SG2008/000295, filed Aug. 11, 2008, entitled "System And Method For Bandpass Sigma-Delta Modulation," which designates the United States of America, and which claims priority to U.S. Provisional Application No. 60/955,208, filed Aug. 10, 2007, entitled "Bandpass Sigma Delta Modulator Employing Electromechanical Loop Filter," the entire content and disclosures of which are hereby incorporated by reference in their entireties.

FIELD OF INVENTION

The present invention relates broadly to a system and method for bandpass sigma-delta modulation.

BACKGROUND

In Intermediate Frequency (IF) digitization receivers, digitization is typically performed by bandpass sigma-delta modulators (BP ΣΔMs). BP ΣΔMs can be realized in both discrete- and continuous-time (DT and CT) domains. DT BP ΣΔMs refer to the ΣΔMs implemented using switched-capacitor (SC) loop filters, while CT BP ΣΔMs are realized using active-RC, transconductor-C (Gm-C) or LC filter.

DT BP ΣΔMs realized using switch-capacitor circuits cannot operate at high speed, while the CT BP ΣΔMs based on active-RC, Gm-C and LC filters suffer from process and temperature variation (PTV) and cannot achieve satisfactory performance, especially when implemented in CMOS/BiCMOS process.

Further, although some CT BP ΣΔMs have achieved reasonably good performance at high IF, they are implemented in costly III-V processes and consume significant power as seen in the CT BP ΣΔMs disclosed in "High Dynamic Range InP HBT Delta-Sigma Analog-to-Digital Converters," *IEEE Journal of Solid-State Circuits*, Vol. 38, No. 9, pp. 1524-1532, September 2003 " by M. Inerfield, et al. and "IF-Sampling Fourth-Order Bandpass ΣΔ Modulator for Digital Receiver Applications," *IEEE Journal of Solid-State Circuits*, Vol. 39, No. 10, pp. 1633-1639, October 2004" by A. E. Cosand, et al. High-performance CT BP ΣΔMs in CMOS/BiCMOS technology at high IF have yet to materialize.

BP ΣΔMs based on electromechanical resonators have been proposed recently in [Y. P. Xu, R. Yu, W. T. Hsu and A. R. Brown, "A Silicon Micromechanical Resonator Based CMOS Bandpass Sigma-Delta Modulator," in *Proc. of Asian Solid-State Circuit Conference (A-SSCC'06)*, November 2006. pp. 143-146; R. Yu, Y.P. Xu, "A 47.3-MHz SAW Resonator Based CMOS Second-Order Bandpass Sigma-Delta Modulator with 54-dB Peak SNDR," in *Proc. IEEE Custom Integrated Circuits Conf. (CICC'05*, pp. 203-206, September 2005]. These BP ΣΔMs achieve comparable or better SNDR (Signal to Noise plus Distortion Ratio) performances in narrowband (200 kHz) FM application, but are more suitable for narrowband applications. Although multiple resonators with different center frequencies can be used to achieve a wider passband in a higher-order loop filter, they are difficult to realize in practice due to the increased parasitics and complexity.

Therefore, there exists a need to provide a system and method for a bandpass sigma-delta modulator to address one or more of the problems mentioned above.

SUMMARY

In accordance with a first aspect of the present invention, there is provided a continuous time bandpass sigma-delta modulator comprising an electromechanical filter, a quantizer coupled to an output from the electromechanical filter; and a feedback circuit coupled between an output from the quantizer and an input of the electromechanical filter.

A loop from the output of the quantizer to the input of the quantizer through the feedback circuit may provide a transfer function for mimicking a discrete time bandpass sigma-delta modulator prototype.

The transfer function of the loop is determined based on a transfer function of the electromechanical filter.

The transfer function of the loop may be further determined based on a selected out-of band gain in the discrete time bandpass sigma-delta modulator prototype.

The modulator may comprise a first adder for summing an input signal with a first set of feedback signals to generate a first combined analogue signal; the electromechanical filter coupled to receive the first combined analogue signal; a second adder coupled to the filter for summing a filtered signal generated by the filter with an other feedback signal to generate a second combined analogue signal; the quantizer coupled to the second adder to receive the second combined analogue signal and for generating a digital output signal;

Each feedback signal may be generated by respective feedback paths, each feedback path comprising one or more latches for delaying the digital output signal; a digital to analogue converter for converting the delayed digital output signal into an analogue signal; and a multiplier for multiplying a coefficient to the analogue signal to produce the feedback signal.

The electromechanical filter may comprise one or more of a group consisting of MEMS, BAW, SAW filters.

In accordance with a second aspect of the present invention, there is provided a method for continuous time bandpass sigma-delta modulation, the method comprising the steps of filtering an analogue signal using an electromechanical filter, coupling a quantizer to an output from the electromechanical filter; and providing a return signal from a feedback circuit coupled between an output from the quantizer and an input of the electromechanical filter.

The method may further comprise providing a transfer function for mimicking a discrete time bandpass sigma-delta modulator prototype by a loop from the output of the quantizer to the input of the quantizer through the feedback circuit.

The method may further comprise determining the transfer function of the loop based on a transfer function of the electromechanical filter.

The method may further comprise the step of determining the transfer function of the loop based on a selected out-of band gain in the discrete time bandpass sigma-delta modulator prototype.

The method may further comprise the steps of summing an input signal with a first set of feedback signals to generate a first combined analogue signal with a first adder; receiving the first combined analogue signal with an electromechanical filter; summing a filtered signal generated by the filter with an other feedback signal to generate a second combined analogue signal with a second adder to the filter, receiving the second combined analogue signal and generating a digital output signal with the quantizer;

Each feedback signal may be generated by respective feedback paths comprising the steps of delaying the digital output signal by one or more latches; converting the delayed digital output signal into an analogue signal by a digital to analogue converter; and multiplying a coefficient to the analogue signal to produce the feedback signal by a multiplier.

The electromechanical filter may comprise one or more of a group consisting of MEMS, BAW, SAW filters.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

In embodiments of the present invention, there is provided a BP ΣΔM employing an electromechanical loop filter which can be any of e.g. micro-mechanical (MEMS) filters, surface acoustic wave (SAW) filters, bulk acoustic wave (BAW) filters or other electromechanical filters. An example embodiment has multi-feedback paths to realize the desired loop transfer function and ensure the stability of the ΣΔM. A wideband transimpedance amplifier (TIA) is placed after the electromechanical loop filter and may provide insertion loss compensation and/or minimize the phase delay in the forward path of the BP ΣΔM.

Unlike the previously proposed electromechanical resonator based BP ΣΔMs and III-V process based implementations, the electromechanical filters in the example embodiment can provide accurate center frequency without frequency tuning and may be low in power consumption. Thus, the impulse response of the electromechanical filter based CT BP ΣΔM can be matched to that of a DT BP ΣΔM prototype at the input of the quantizer, in time domain. Since the pole frequencies are known and cannot be changed for the given SAW filter, the loop transfer function of a DT BP ΣΔM prototype can be mimicked with the same pole placement in the passband and proper choice of out-of-band gain. In other words, the transfer function of the electromechanical filter based CT BP ΣΔM may be determined based on a selected out-of band gain in the DT BP ΣΔM prototype.

Using higher-order electromechanical filter as a loop filter in the BP ΣΔM in the example embodiment, while there is limited controllability because the filter only has two accessible terminals, input and output, issues such as loop transfer function and stability can be dealt with using ancillary circuits.

Figure 1:
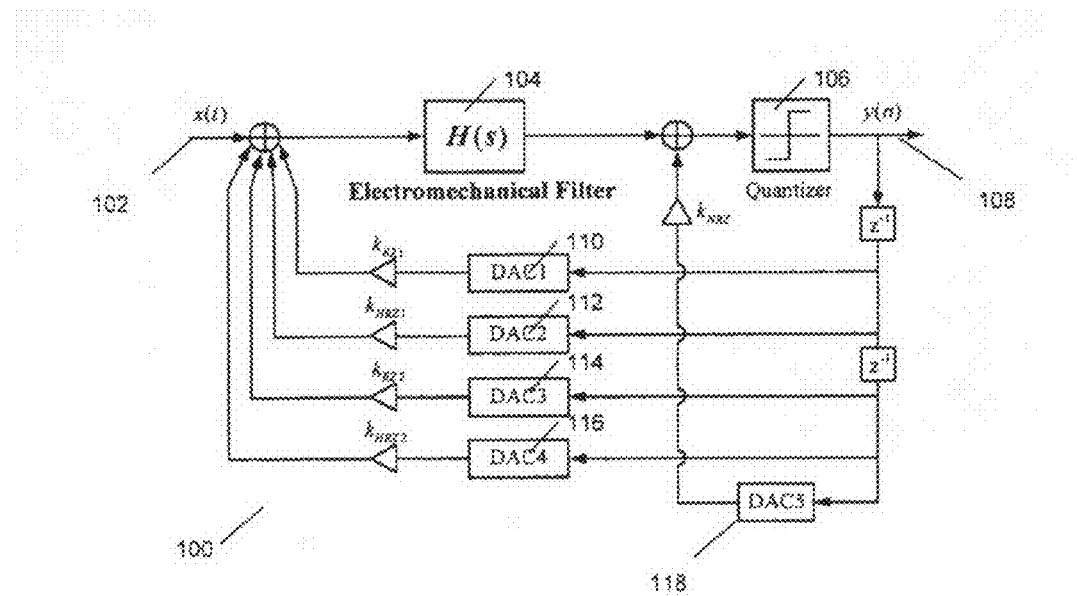
FIG. 1 shows a system-level block diagram of an example embodiment of a continuous-time (CT) BP ΣΔM employing 4th-order electromechanical filter as loop filter.

FIG. 1 shows a system-level block diagram of an example embodiment of a continuous-time (CT) BP ΣΔM employing 4th-order electromechanical filter as loop filter. A multi-feedback structure is used to provide controllability and obtain the desired loop transfer function which results in a stable BP ΣΔM.

The input signal 102, after subtracting the feedback signals from DACs (DAC1-4) 110, 112, 114, 116, is fed to the electromechanical loop filter 104. The output of the loop filter 104 subtracts the feedback from DAC5 118 before it is digitized by the quantizer 106. The output of the quantizer 106 is the final output 108 of the BP ΣΔM 100. In the feedback paths, the digital output 108 is first delayed by one sampling period, and then converted back to the analog signals by five RZ (Return to Zero) or NRZ (Non Return to Zero) DACs 110, 112, 114, 116, 118. The outputs of the first four RZ DACs (DAC1-4) 110, 112, 114, 116 are fed or returned back to the input node with different coefficients and summed with the input signal 102. There is an inherent half clock delay embedded in DAC2 112 and DAC4 116, which is the difference between the RZ DACs 110, 114 and HRZ (Half Return to Zero) DACs 112, 116. The output of the fifth NRZ DAC (DAC5) 118 is fed back to the input of the quantizer 106. The feedback coefficients are determined based on the impulse-invariance transformation given in Equation (1), $$H(z) = Z\{L^{-1}[H(s)D(s)]|_{t=nT_s}\} \quad (1)$$

where H(z) is the DT loop transfer function, H(s) is the transfer function of the CT loop filter, and D(s) is the linear combination of the DACs 110, 112, 114, 116, 118 in the feedback path.

The characteristic of the electromechanical filter 104 depends very much on its structure. The BP ΣΔM in the embodiments of the present invention is based on the mechanically-coupled MEMS filter and the longitudinally-coupled resonators (LCRs) based SAW filter.

Figure 2:
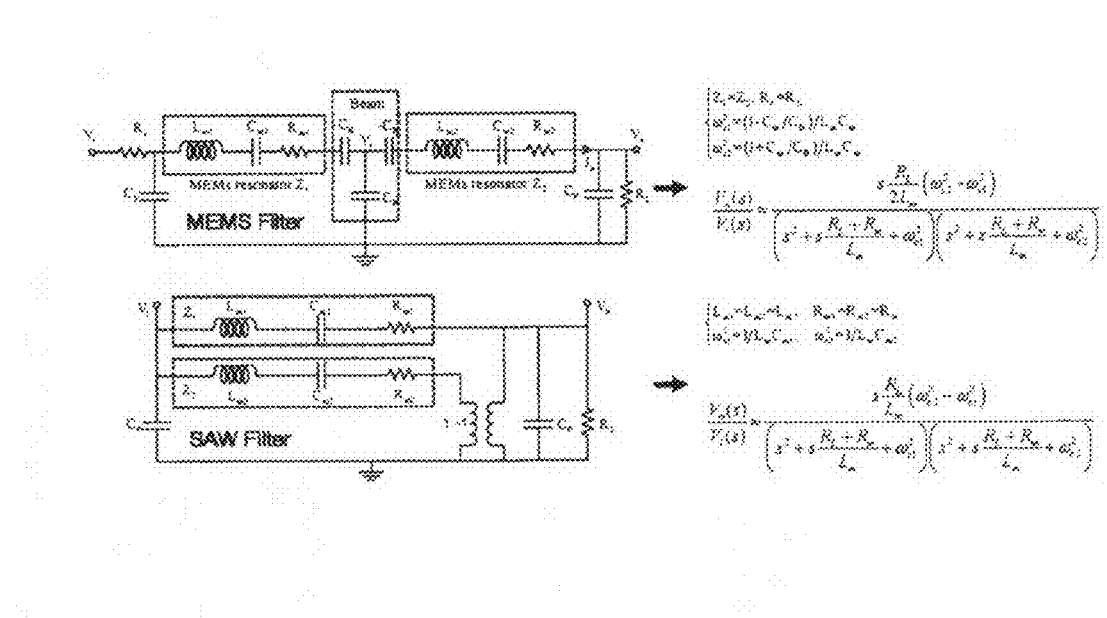
FIG. 2 shows the equivalent circuits of the MEMs and the SAW filters in the example embodiments.

FIG. 2 shows the equivalent circuits of the MEMs [F. D. Bannon III, J. R. Clark and C. T.-C. Nguyen, "High-Q HF Microelectromechanical Filters," *IEEE Journal of Solid-State Circuits*, Vol. 35, pp. 512-526, April 2000] and the SAW [C. K. Campell, Surface Acoustic Wave Devices for Mobile and Wireless Communications, Academic Press, 1998] filters in the example embodiment. Under certain assumptions provided in FIG. 2, both filters have a similar 4th-order transfer function, which can be generalized by $$H(s) = \frac{As}{\left(s^2 + \frac{\omega_c}{Q_r}s + \omega_{c1}^2\right) \cdot \left(s^2 + \frac{\omega_c}{Q_r}s + \omega_{c2}^2\right)} \quad (2)$$

where $\omega_{c1}$ and $\omega_{c2}$ are commonly chosen to be symmetric around a given center frequency $\omega_c$, thus $\omega_c=(\omega_{c1}+\omega_{c2})/2$. Let $\omega_{c1}=\omega_c-\Delta\omega$, and $w_{c2}=\omega_c+\Delta\omega$, a good rule of thumb is to choose $2\times\omega=\omega_c/Q_r$, $Q_r$ is the loaded quality factor of the constituent resonator, given by $$Q_r = \sqrt{L_m/C_m}/(R_L+R_m) \quad (3)$$

The resultant 3-dB filter bandwidth is BW=4Δω. Note that static capacitance $C_p$ at input and output terminals is ignored to simplify the derivation; its effect can be compensated by proper design of the interface circuits which will be discussed later.

In the embodiment, a SAW filter is used. It will be appreciated by a person skilled in the art that the design methodology can, however, also be applied to the MEMS, BAW and other electromechanical filters. The SAW filter used in the embodiment has a bandwidth of 1.152 MHz centered at 110 MHz. The pole frequencies of this SAW filter have already been determined by $f_c \pm \Delta f = 110 \pm 10.288$-MHz, and loaded Q of constituent resonator is $Q_r = f_c/2\Delta f = 191$.

The system-level design in the example embodiment is based on impulse invariance transformation, in which the impulse response of the electromechanical filter based CT BP ΣΔM can be matched to that of a DT BP ΣΔM prototype at the input of the quantizer in time domain. Since the pole frequencies are known and cannot be changed for the given SAW filter, the loop transfer function of the DT BP ΣΔM prototype can be mimicked with the same pole placement in the passband and proper choice of out-of-band gain. The resultant transfer function is given by $$H(z) = \frac{1 - NTF(z)}{NTF(z)} = \frac{1.236025z^2 \div 0.763941}{z^2 + 1.999932z^2 + 1} \quad (4)$$

In the example embodiment, to match the transfer function of the electromechanical filter based CT BP ΣΔM to that of a DT BP ΣΔM prototype, four independent feedback paths to the input with the combination of RZ and HRZ DACs are implemented. With one clock period delay added after the quantizer to alleviate the metastability problem, a fifth NRZ DAC provides full equivalence, as shown in FIG. 1. The feedback coefficients or the gain of DACs can be determined according to the impulse invariance transformation.

In the example embodiment, the transfer function of the electromechanical filter is presumed to have the form of equation (1). However, the inherent non-idealities, such as insertion loss (IL) and parasitic capacitance $C_p$ (FIG. 2) will affect the performance of the BP ΣΔM. The effect of IL on the performance of ΣΔM has been studied in "A Silicon Micromechanical Resonator Based CMOS Bandpass Sigma-Delta Modulator," in *Proc. IEEE A-SSCC '06*, November 2006. pp. 143-146. [Xu et al.]. In general, a sufficient forward loop gain may be required to suppress the in-band noise and alleviate the stringent requirement on the quantizer. For one-bit quantizer used in the example embodiment, simulation in circuit level can be used to determine the minimal forward loop gain. Simulation indicates that 50-dB gain may be needed before the output signals of the SAW filter in use are quantized. This gain is provided by the sensing amplifier (30 dB) for the SAW filter and the pre-amplifier (20 dB) of the quantizer. However, the gain stage should preferably not introduce excess phase delay in the vicinity of the passband. To analyze the effect of phase delay, the gain stage is modeled by a first-order system with its transfer function given by, $$A_G(s) = \frac{A_{G0}}{1 + s/\omega_p} \quad (5)$$

where $A_{G0}$ is the DC gain and $\omega_p$ is the pole frequency. The phase delay ($\theta_d$) introduced by the gain stage at the center frequency $\omega_c$, is $\theta_d = \tan^{-1}(\omega_c/\omega_p)$.

Figure 3:
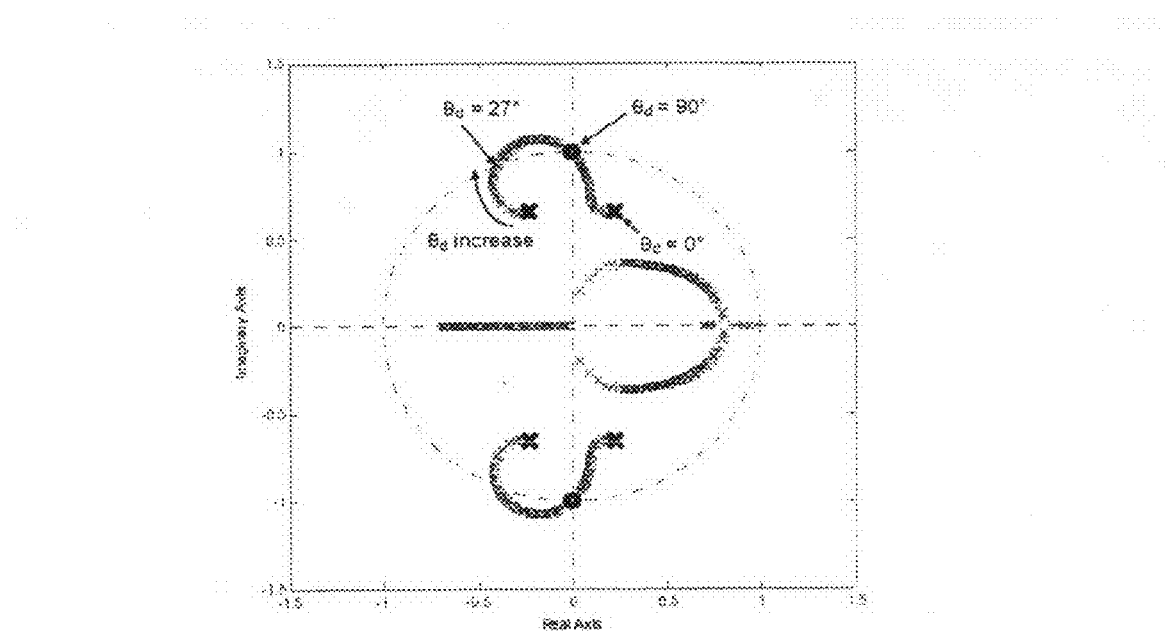
FIG. 3 shows a root-locus plot of the noise transfer function with the phase delay $\theta_d$ in the forward path as a parameter.

FIG. 3 shows a root-locus plot of the noise transfer function with the phase delay $\theta_d$ in the forward path as a parameter. The plot shows that the modulator in the example embodiment becomes unstable when the phase delay is greater than 27°. This suggests that the phase delay of the gain stage in the forward path of the ΣΔM is preferably minimized. In other words, the gain stage should preferably have sufficient bandwidth or negligible phase delay around the passband.

Figure 4:
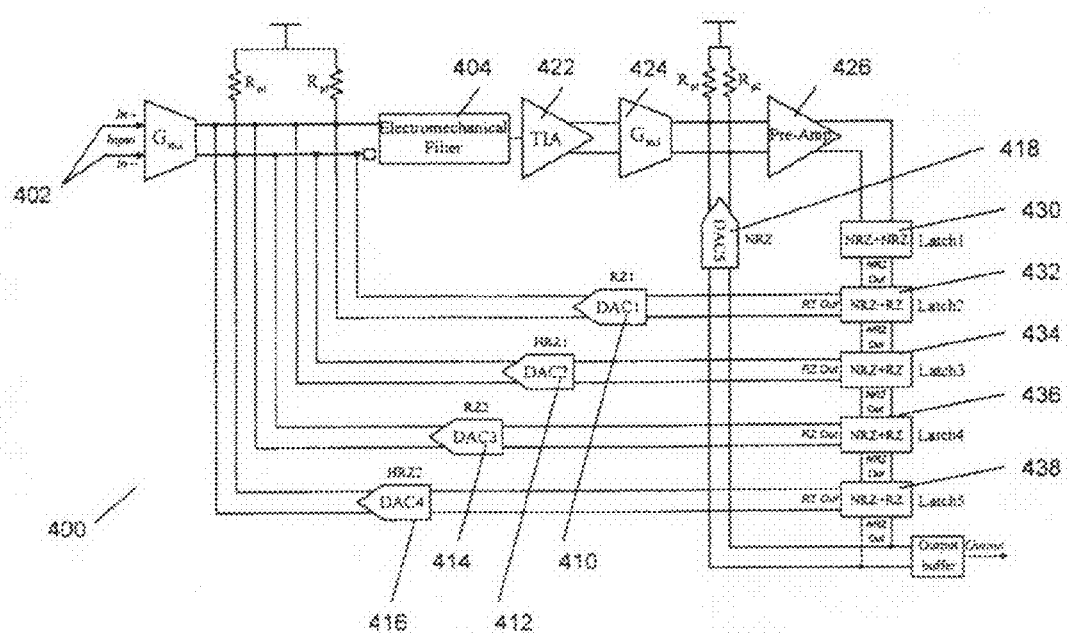
FIG. 4 shows the simplified circuit-level structure of an example embodiment of the proposed BP ΣΔM employing an external 110-MHz SAW filter.

FIG. 4 shows the simplified circuit-level structure of an example embodiment of the proposed BP ΣΔM employing an external 110-MHz SAW filter. The transconductor $G_{m,i}$ 420 converts the input signal 402 to current for the summation with the feedback signals from four current steering DACs 410, 412, 414, 416. The single-ended signal is used to drive the offchip SAW filer. The other output drives a floating pad so as to balance the loading. The single-ended output from the electromechanical filter 404 is sensed and amplified by a TIA 422, and then converted to a differential signal. A second transconductor 424 then converts the differential signal into current for subsequent subtraction of the weighed NRZ DAC 418 current, producing a summation signal. The summation signal is then amplified further by a pre-amplifier 426, and fed to five serially-connected ECL (Emitter Controlled Logic) master-slave latches 430, 432, 434, 436, 438.

Together with the pre-amplifier 426, the first master-slave latch (Latch 1) 430 in which both master and slave stages have NRZ outputs, serves as the quantizer (comparator) in the ΣΔM and provides a half sampling cycle delay. The following four master-slave latches (Latch 2-5) 432, 434, 436, 438 are serially connected by the NRZ master stages and the outputs of their slave RZ stages are used as control signals for the feedback current steering DACs 410, 412, 414, 416. Each latch (Latch 1-5) 430, 432, 434, 436, 438 provides a half clock/cycle delay. Latches 430, 432 provide a total of one clock delay for DAC1 410. Latch 434 provides an additional half clock delay to DAC2 412 such that DAC2 becomes a HRZ DAC. Therefore the delays provided for DAC1-4 410, 412, 414, 416 are 1, 1.5, 2 and 2.5 cycles respectively.

Simulation results show that $G_{m,i}$, feedback DACs (DAC1-4) and pull-up resistors $R_{p1}$ contribute around 80% of the input referred circuit noise of the ΣΔM, and SNR considering only circuit noise is 83 dB in 1-MHz bandwidth after optimization.

As indicated earlier, a TIA with 30-dB gain is used to compensate the insertion loss of electromechanical filter and alleviate the stringent requirement on the quantizer. However, this TIA should not introduce excess phase delay in the vicinity of the passband to prevent the modulator from being unstable. To minimize phase delay at 110 MHz, a bandwidth of more than 1 GHz may be required for the TIA. A straightforward implementation of such a wideband TIA consumes too much power given large parasitic capacitance ($C_p$=5~8 pF) at its input.

Figure 5:
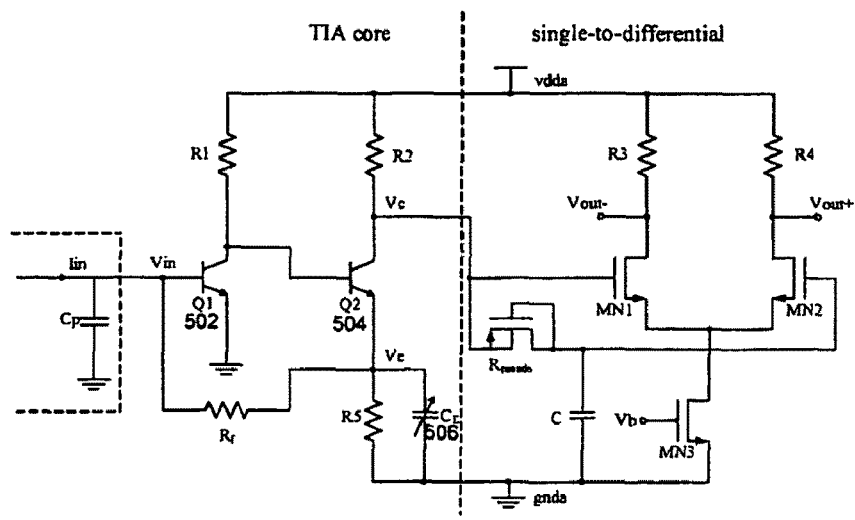
FIG. 5 shows a schematic of a low power TIA in the example embodiment.
Figure 6:
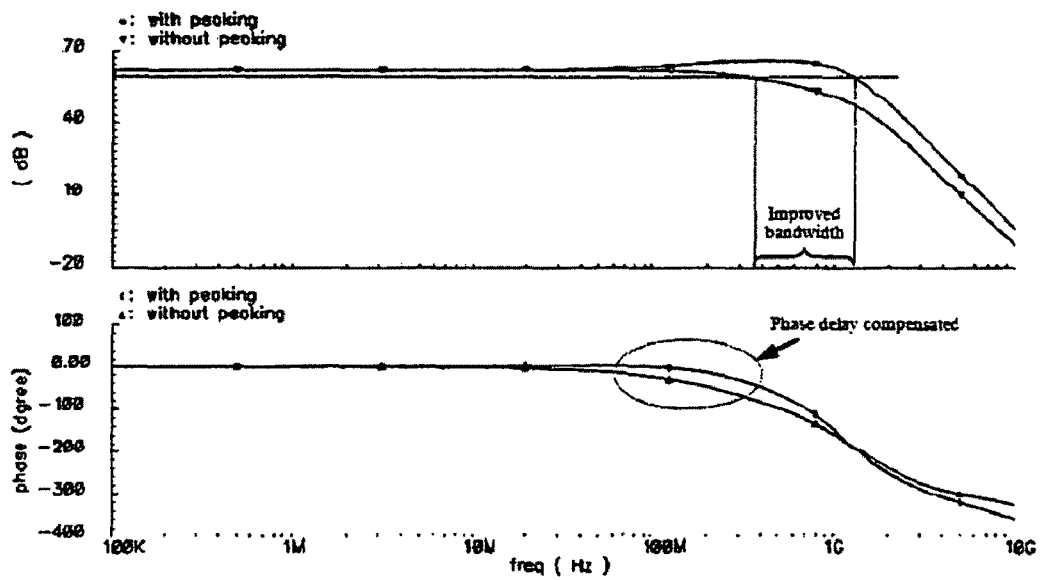
FIG. 6 shows a simulated frequency response of the TIA in the example embodiment.

FIG. 5 shows a schematic of a low power TIA in the example embodiment. Transistors Q1 502 and Q2 504 form the TIA core. Instead of traditional shunt-shunt feedback, the TIA core is based on shunt-series feedback with a peaking capacitor $C_E$ 506 added at the emitter of Q2 504. $C_E$ 506 introduces a zero, which can be adjusted to be near passband and used to broaden the bandwidth of the overall TIA. Given $C_p$=6 pF and $C_E$=0.8 pF, simulation results indicates that the entire TIA has input resistance of 25Ω, transresistance of 62 dBΩ (equivalent 34-dB voltage gain). With $C_E$ 506, the 3-dB bandwidth of the TIA is improved from 360 MHz to 1.3 GHz as illustrated in FIG. 6 at 2-mA current consumption. The resultant phase shift near the passband can be considered negligible.

Figure 7:
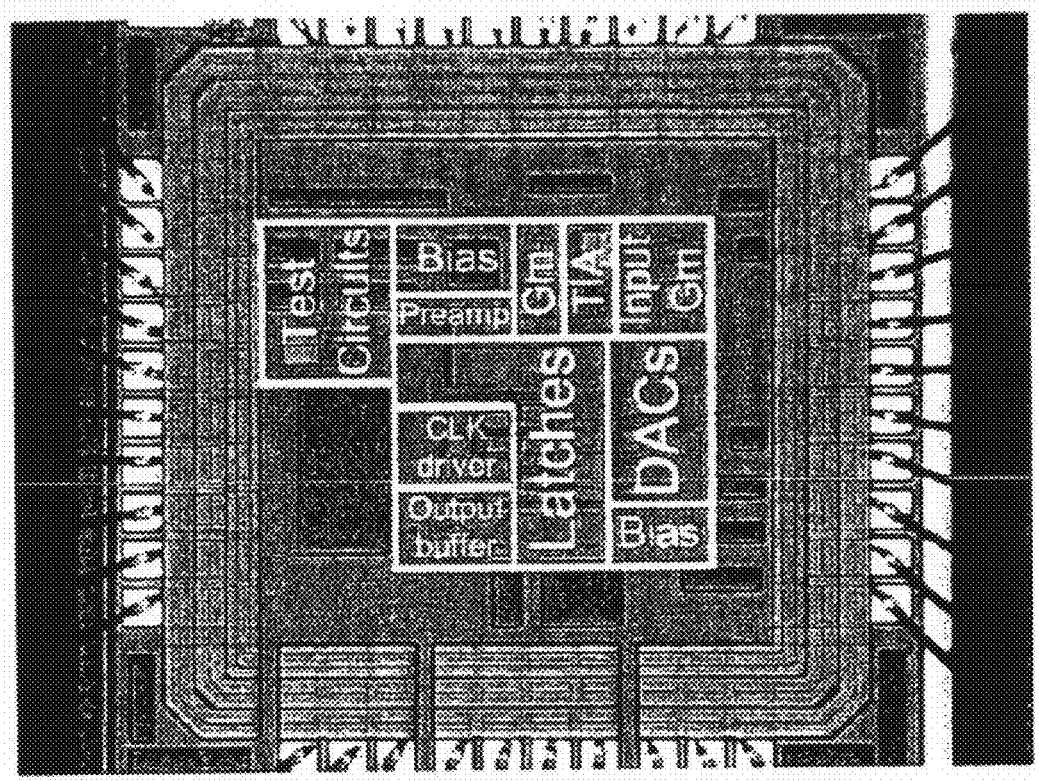
FIG. 7 shows a chip micrograph of the example embodiment of the 4th-order BP ΣΔM fabricated in a 0.35-μm SiGe HBT BiCMOS process.
Figure 8:
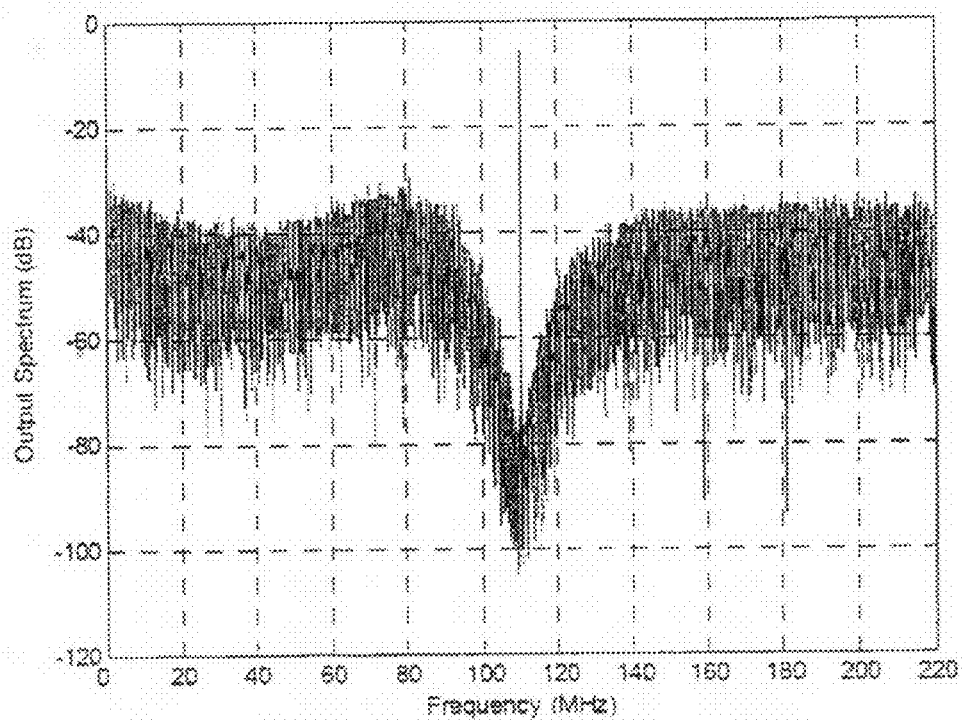
FIG. 8 shows the measured output spectrum of the example embodiment of the 4th-order CT BP ΣΔM.
Figure 9:
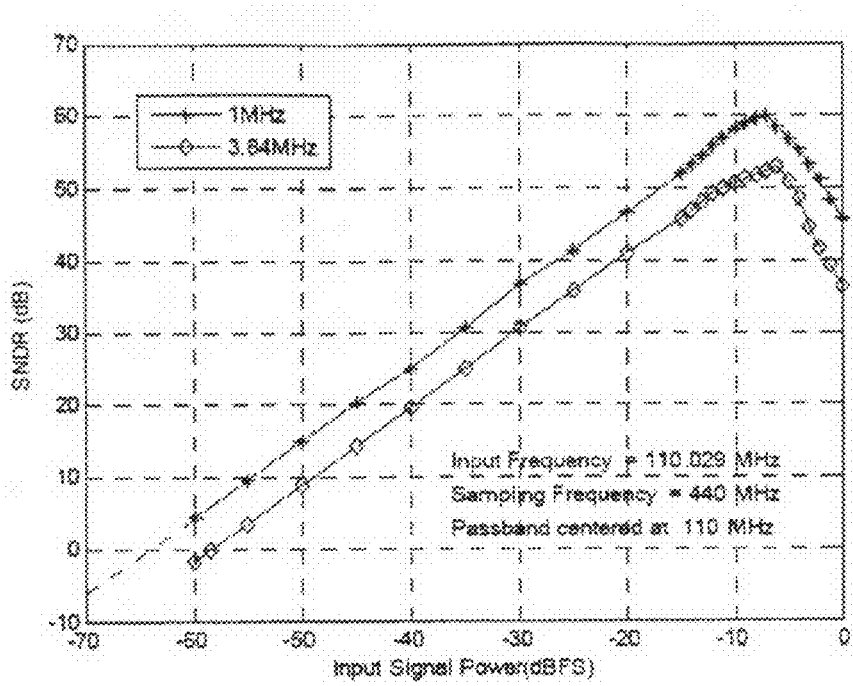
FIG. 9 shows the measured a graph of the SNDR vs. input power of the example embodiment of the 4th-order CT BP ΣΔM.
Figure 10:
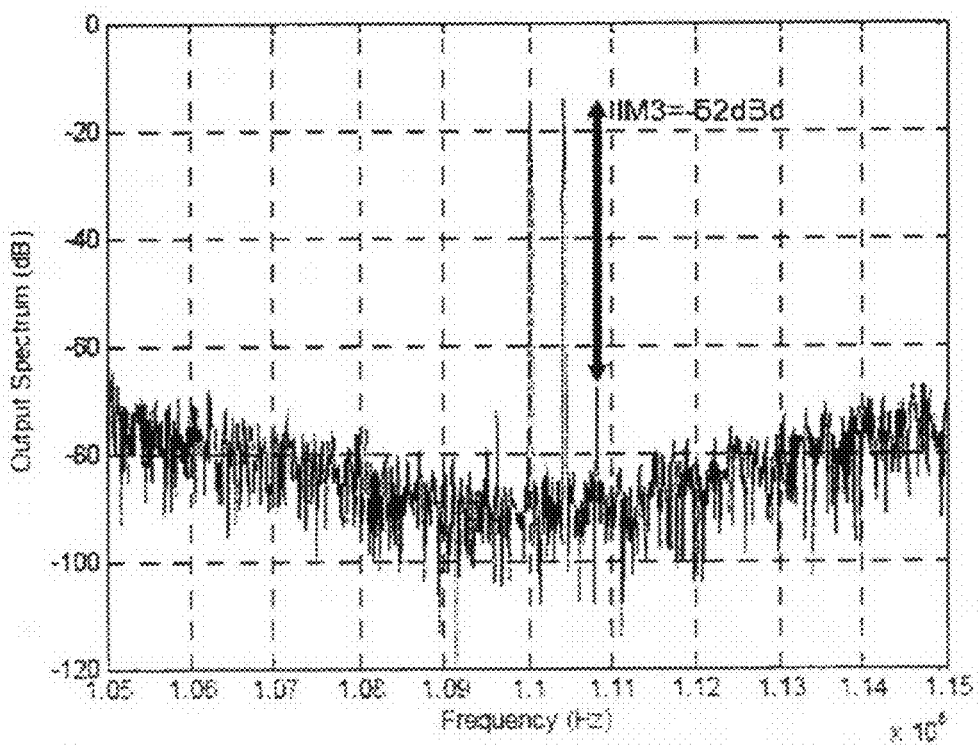
FIG. 10 shows a two-tone test result of the example embodiment.

A prototype chip of the example embodiment of the 4th-order BP ΣΔM fabricated in a 0.35-μm SiGe HBT BiCMOS process and occupying a 0.55-mm² core area. FIG. 7 shows a chip micrograph of the example embodiment of the 4th-order BP ΣΔM fabricated in a 0.35-μm SiGe HBT BiCMOS process in which the main circuit blocks are identified. FIG. 8 shows the measured output spectrum of the example embodiment of the 4th-order CT BP ΣΔM. Note that the frequency bin is about 6.7 kHz. The measured peak SNDR and DR performances in 1-MHz signal bandwidth are 60 dB and 65 dB, respectively, as depicted in FIG. 9. A two-tone intermodulation test was also performed to evaluate the linearity of the designed BP ΣΔM. Two −14 dBFS (FS=500 mVpp) sinusoidal signals with frequency separation of 400 kHz are used to test the modulator. The measured IM3 is about −52 dBc, as shown in FIG. 10. The single-ended interface circuits with SAW filter and large signal dependent-parasitic resulting from the externally connected SAW filter may account for such relatively low linearity.

The measured performance is summarized in Table 1 and compares favorably to known CMOS/BiCMOS single-bit BP ΣΔMs with performances reported in BW>1 MHz. A figure of merit similar to that in *Understanding Delta-Sigma Data Converters*. IEEE Press, 2005 [R. Schreier and G. C. Temes] is used for comparison and is defined as $$FOM=SNDR+10\log(BW/Power) \qquad (6)$$

TABLE 1

Performance summary and comparison

| Design | This Work | [10] | [11] | [12] |
|---|---|---|---|---|
| Process(μm) | 0.35-SiGe BiCMOS | SiGe | 0.35-CMOS | 0.35-CMOS |
| Supply (V) | 3 | 3 | ±1.25 | 3.3 |
| Type | SAW Filter | Gm-C | SC | SC |
| Power (mW) | 57 | 64 | 47.5 | 37 |
| Clock (MHz) | 440 | 800 | 92 | 240 |
| Center (MHz) | 110 | 200 | 23 | 60 |
| BW (MHz) | 1 | 1.97 | 3.84 | 1/1.25 |
| DR (dB) | 65 | 56 | N/A | N/A |
| SNDR (dB) | 60 | 58 | 54 | 55/52 |
| FOM | 132.4 | 132.9 | 133 | 129.3/127.3 |

Embodiments of the present invention seek to realize wideband high IF BP ΣΔMs employing electromechanical filters through the use of electromechanical filters such as micromechanical (MEMS) filters, surface acoustic wave (SAW) filters, bulk acoustic wave (BAW) filters, in CMOS/BiCMOS technology. Compared with the existing electronic filters (e.g. active-RC, Gm-C, LC) in CMOS/BiCMOS processes, the electromechanical filter can provide accurate center frequency without frequency tuning and may be low in power consumption. Therefore, costly III/VI process can be avoided in the design of wideband high IF BP ΣΔM. Furthermore, electromechanical filters can be silicon compatible. The fabrication process of electromechanical filters is understood by a person skilled in the art, and reference is made to e.g. a description of a process for fabricating a SAW filter [Modeling and Fabrication of CMOS Surface Acoustic Wave Resonators, Anus Nurashikin Nordin, IEEE Transactions on Microwave Theory and Techniques, Vol. 55, No. 5, May 2007].

The potential applications include IF and any other bandpass digitization in wireless/wireline receivers, base stations and software defined radios.

The invention may be implemented as hardware modules. More particular, in the hardware sense, a module is a functional hardware unit designed for use with other components or modules. For example, a module may be implemented using discrete electronic components, or it can form a portion of an entire electronic circuit such as an Application Specific Integrated Circuit (ASIC). Numerous other possibilities exist which will be understood by those skilled in the art.

Figure 11:
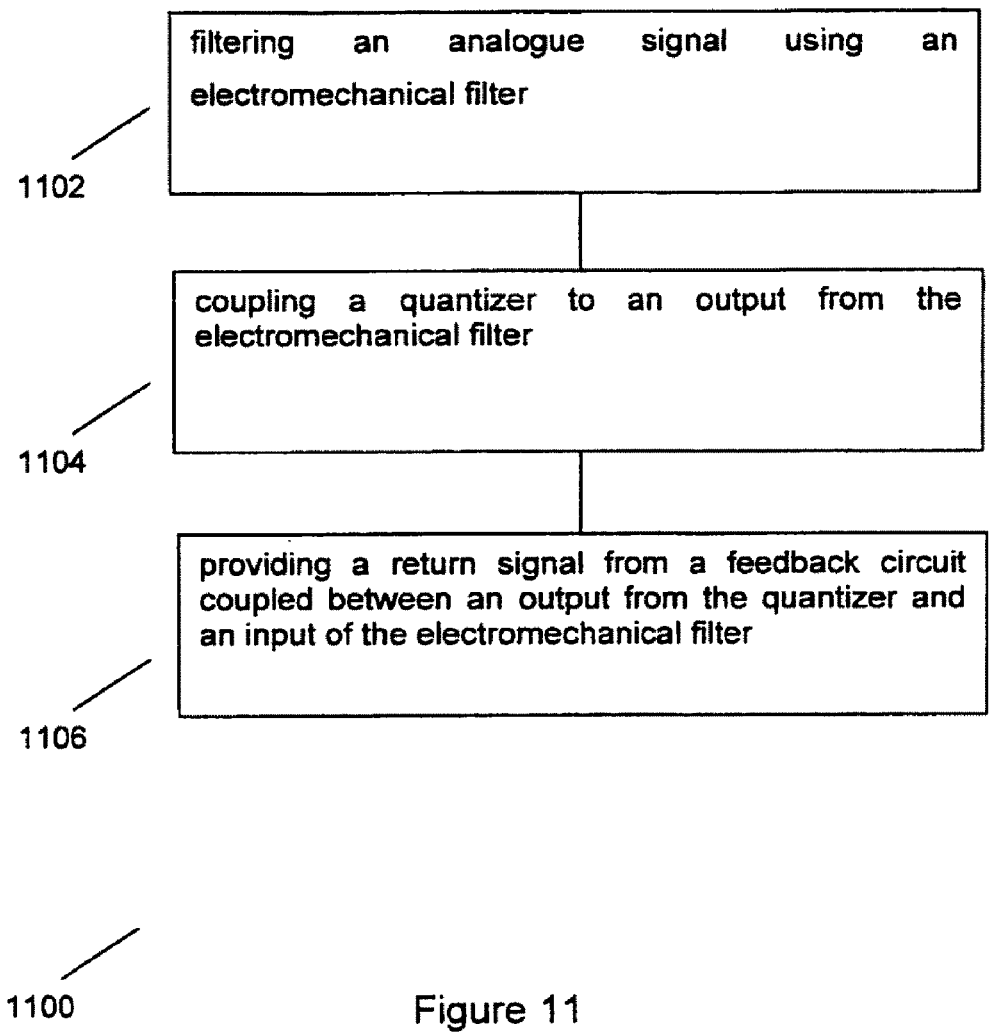
FIG. 11 shows a flow chart illustrating a method for continuous time bandpass sigma delta modulation.

FIG. 11 shows a flow chart 1100 illustrating a method for continuous time bandpass sigma delta modulation. At step 1102, an analogue signal is filtered using an electromechanical filter. At step 1104, a quantizer is coupled to an output from the electromechanical filter. At step 1106, a return signal is provided from a feedback circuit coupled between an output from the quantizer and an input of the electromechanical filter.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. An apparatus, comprising:
an electromechanical filter;
a quantizer coupled to the electromechanical filter; and
a feedback circuit coupled between the quantizer and the electromechanical filter, wherein the feedback circuit includes a plurality of digital to analog converters respectively coupled between an output of the quantizer and an input of the electromechanical filter to form, respectively, a plurality of feedback loops between the quantizer and the electromechanical filter.

2. The apparatus of claim 1, wherein at least one of the digital to analog converters is a return to zero (RZ) or half return to zero (HRZ) digital to analog converter.

3. The apparatus of claim 1, wherein a loop transfer function of the feedback circuit is configured to operate based on a transfer function of the electromechanical filter.

4. The apparatus of claim 3, wherein the apparatus is a continuous time bandpass sigma-delta modulator, and wherein the loop transfer function is further configured to operate based on an out-of band gain of a discrete time bandpass sigma-delta modulator prototype with same pole placement in a passband of the electromechanical filter.

5. The apparatus of claim 1, further comprising:
a first adder coupled with the input of the electromechanical filter, wherein the first adder is configured to combine an input signal with a plurality of feedback signals generated respectively from the plurality of digital to analog converters to produce a first combined analog signal, for the electromechanical filter to use to generate a filtered signal based on the first combined analog signal;
another feedback circuit including another digital to analog converter coupled between the output of the quantizer and an input of the quantizer to form another feedback loop; and
a second adder coupled with an output of the electromechanical filter and the input of the quantizer, wherein the second adder is configured to combine another feedback signal generated from the other digital to analog converter with the filtered signal to generate a second combined analog signal;

wherein the quantizer is configured to quantize the second combined analog signal to generate a digital output signal.

6. The apparatus of claim 5, further comprising:
a plurality of latches coupled to the output of the quantizer and configured to produce a plurality of delayed digital output signals based on the digital output signal,
wherein respective ones of the plurality of digital to analog converters are coupled to one or more of the plurality of latches, and are configured to convert the plurality of delayed digital output signals into a plurality of delayed analog signals, respectively.

7. The apparatus of claim 5, wherein the feedback circuit includes four feedback paths, and wherein the plurality of feedback signals include four feedback signals having, respectively, 1, 1.5, 2, and 2.5 clock cycle delays compared to the digital output signal.

8. The apparatus of claim 6, further comprising a multiplier coupled to at least one of the plurality of analog to digital converters, wherein the multiplier is configured to multiply a coefficient to the at least one of the plurality of delayed analog signals to produce at least one of the plurality of feedback signals.

9. The apparatus of claim 1, wherein the electromechanical filter comprises one or more of a group consisting of a micro-electro-mechanical (MEMS) filter, a bulk acoustic wave (BAW) filter, and a surface acoustic wave (SAW) filter.

10. The apparatus of claim 1, further comprising a transimpedance amplifier coupled to the electromechanical filter, wherein the transimpedance amplifier includes two transistors configured to form a shunt-series feedback loop.

11. The apparatus of claim 1, wherein the quantizer includes a pre-amplifier and a master-slave latch, and wherein master and slave stages of the master-slave latch have non return to zero (NRZ) outputs.

12. A method, comprising:
filtering, by an electromechanical filter, a first analog signal to generate a filtered signal;
digitizing, by a quantizer, the filtered signal to generate a digital output signal; and
converting, by a feedback circuit having a plurality of digital to analog converters, the digital output signal into a plurality of second analog signals, respectively, wherein respective ones of the plurality of digital to analog converters are coupled between an output of the quantizer and an input of the electromechanical filter to form, respectively, a plurality of feedback loops between the quantizer and the electromechanical filter;
wherein the plurality of second analog signals are used to form the first analog signal.

13. The method of claim 12, wherein filtering the first analog signal comprises filtering, by a surface acoustic wave (SAW) filter, the first analog signal to generate the filtered signal.

14. The method of claim 12, wherein filtering the first analog signal comprises filtering, by a bulk acoustic wave (BAW) filter, the first analog signal to generate the filtered signal.

15. The method of claim 12, wherein filtering the first analog signal comprises filtering, by a micro-electromechanical system (MEMS) filter, the first analog signal to generate the filtered signal.

16. An apparatus, comprising:
means for filtering a first analog signal to generate a filtered signal;
means for digitizing the filtered signal to generate a digital output signal; and
means for converting the digital output signal into a plurality of second analog signals, wherein said means for converting include a plurality of digital to analog converters respectively coupled between an output of said means for digitizing and an input of said means for filtering to form a plurality of feedback loops between said means for digitizing and said means for filtering; and
wherein the plurality of second analog signals are used to form the first analog signal.

17. The apparatus of claim 16, further comprising means for combining the plurality of second analog signals with an input signal to form the first analog signal.

* * * * *

UNITED STATES PATENT AND TRADEMARK OFFICE
CERTIFICATE OF CORRECTION

PATENT NO. : 8,072,363 B2
APPLICATION NO. : 12/672348
DATED : December 6, 2011
INVENTOR(S) : Yu et al.

Page 1 of 1

It is certified that error appears in the above-identified patent and that said Letters Patent is hereby corrected as shown below:

On Page 2, item (56), under "OTHER PUBLICATIONS", in Column 2, Line 13, delete "Curcuits" and insert -- Circuits --, therefor.

In Column 2, Line 30, delete "signal;" and insert -- signal. --, therefor.

In Column 2, Line 65, delete "filter," and insert -- filter; --, therefor.

In Column 2, Line 67, delete "quantizer;" and insert -- quantizer. --, therefor.

In Column 4, Line 63, delete "$w_{c2}=\omega_c+\Delta\omega$," and insert -- $\omega_{c2}=\omega_c+\Delta\omega$, --, therefor.

In Column 4, Line 64, delete "$2x\omega=\omega_c/Q_r$," and insert -- $2\Delta\omega=\omega_c/Q_r$, --, therefor.

In Column 5, Line 12, delete "$f_c\pm\Delta f=110\pm10.288$-MHz," and insert -- $f_c\pm\Delta f=110\pm0.288$-MHz, --, therefor.

Signed and Sealed this
Twelfth Day of June, 2012

David J. Kappos
*Director of the United States Patent and Trademark Office*